United States Patent
Griswold et al.

(10) Patent No.: US 7,741,843 B2
(45) Date of Patent: Jun. 22, 2010

(54) DETERMINING PHASE-ENCODING DIRECTION FOR PARALLEL MRI

(75) Inventors: Mark A. Griswold, Shaker Heights, OH (US); Martin Blaimer, Cleveland Heights, OH (US); Felix Breuer, Würzburg (DE)

(73) Assignee: CaseWestern Reserve University, Cleveland, OH (US)

(*) Notice: Subject to any disclaimer, the term of this patent is extended or adjusted under 35 U.S.C. 154(b) by 8 days.

(21) Appl. No.: 12/150,848

(22) Filed: May 1, 2008

(65) Prior Publication Data
US 2008/0290868 A1    Nov. 27, 2008

Related U.S. Application Data

(60) Provisional application No. 60/927,178, filed on May 2, 2007.

(51) Int. Cl.
G01V 3/00    (2006.01)
(52) U.S. Cl. ...................................................... 324/307
(58) Field of Classification Search ......... 324/300–322; 600/410–435
See application file for complete search history.

(56) References Cited

U.S. PATENT DOCUMENTS

| | | | | |
|---|---|---|---|---|
| 4,888,552 A * | 12/1989 | Egozi et al. | ................. | 324/309 |
| 5,539,316 A * | 7/1996 | Sukumar | ..................... | 324/320 |
| 5,631,560 A * | 5/1997 | Machida | ..................... | 324/309 |
| 5,926,021 A * | 7/1999 | Hennig | ........................ | 324/306 |
| 7,545,141 B2 * | 6/2009 | Kimura | ....................... | 324/306 |

* cited by examiner

Primary Examiner—Brij B Shrivastav
Assistant Examiner—Dixomara Vargas
(74) Attorney, Agent, or Firm—Kraguljac & Kalnay, LLC

(57) ABSTRACT

Example systems, methods, and apparatus associated with determining a phase-encoding direction for parallel MRI are described. One example, method includes selecting a set of projection directions along which an MRI apparatus is to apply RF energy to an object to be imaged. The method includes controlling the MRI apparatus to selecting a set of projection directions and to acquire MR signal from the object through a set of detectors. The method includes analyzing the MR signal to identify individual sensitivities for members of the set of detectors and selecting a phase-encoding direction for a pMRI session based on the individual sensitivities for the members. The method produces a concrete, tangible, and useful result by controlling the MRI apparatus to perform the pMRI session based on the selected phase-encoding direction.

12 Claims, 9 Drawing Sheets

DETERMINING PHASE-ENCODING DIRECTION FOR PARALLEL MRI

CROSS REFERENCE TO RELATED APPLICATIONS

This application claims the benefit of U.S. Provisional Patent 60/927,178, filed May 2, 2007, by the same inventors.

COPYRIGHT NOTICE

A portion of the disclosure of this patent document contains material that is subject to copyright protection. The copyright owner has no objection to the facsimile reproduction of the patent document or the patent disclosure as it appears in the Patent and Trademark Office patent file or records, but otherwise reserves all copyright rights whatsoever.

BACKGROUND

A Magnetic Resonance Imaging (MRI) apparatus that performs parallel MRI (pMRI) may include an array of detectors. The array of detectors may be referred to as an array of coils. The pMRI apparatus may acquire signals from the array of detectors. The detectors may be arranged in a phased array of coils where individual coils in the phased array may have localized sensitivity. While the sensitivities of different coils are conceptually smooth over a field of view (FOV), actual image acquisitions may yield different results than that predicted by a theoretical design. Thus, reconstruction of a magnetic resonance (MR) image from signals acquired from a phased array of coils associated with a pMRI apparatus may depend on understanding the actual sensitivity and spatial encoding capabilities of a coil(s) during a pMRI session.

Spatial encoding capabilities of the members of the set of detectors may vary with respect to, for example, orientation to a projection direction. For example, a set of coils oriented perpendicular to a projection direction may produce a first spatial encoding capability. A set of coils oriented parallel to a projection direction may produce a second spatial encoding capability. Additionally, when coils are oriented at varying angles with respect to a projection direction varying spatial encoding capabilities may be available. Thus, pMRI performance may depend on the choice of a phase-encoding direction employed in an MRI session due to the effect on spatial encoding capabilities of members of a phased array of coils. This pMRI performance may be reflected, for example, in image reconstruction quality. Conventionally, selecting a phase-encoding direction in pMRI may not have occurred or may have been uninformed and thus may have produced sub-optimal results.

BRIEF DESCRIPTION OF DRAWINGS

The accompanying drawings, which are incorporated in and constitute a part of the specification, illustrate various example systems, methods, and other example embodiments of various aspects of the invention. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

DETAILED DESCRIPTION

Example systems, methods, and apparatus facilitate selecting phase-encoding directions for a pMRI session. In one example, a phase-encoding direction may be selected that optimizes spatial encoding and thus signal acquisition for a pMRI session. In another example, a set of phase-encoding directions may be tested and one of the tested directions may be selected. While this may not yield optimal spatial encoding, it may yield better spatial encoding than an uninformed or random selection. In another example, a set of phase-encoding directions may be sampled and then a "zeroing-in" process may be undertaken to quickly arrive at a desired phase-encoding direction. Selecting a phase-encoding direction based on real-time feedback from an actual pMRI session facilitates improving reconstruction quality of pMRI by facilitating improved spatial encoding.

Figure 2:
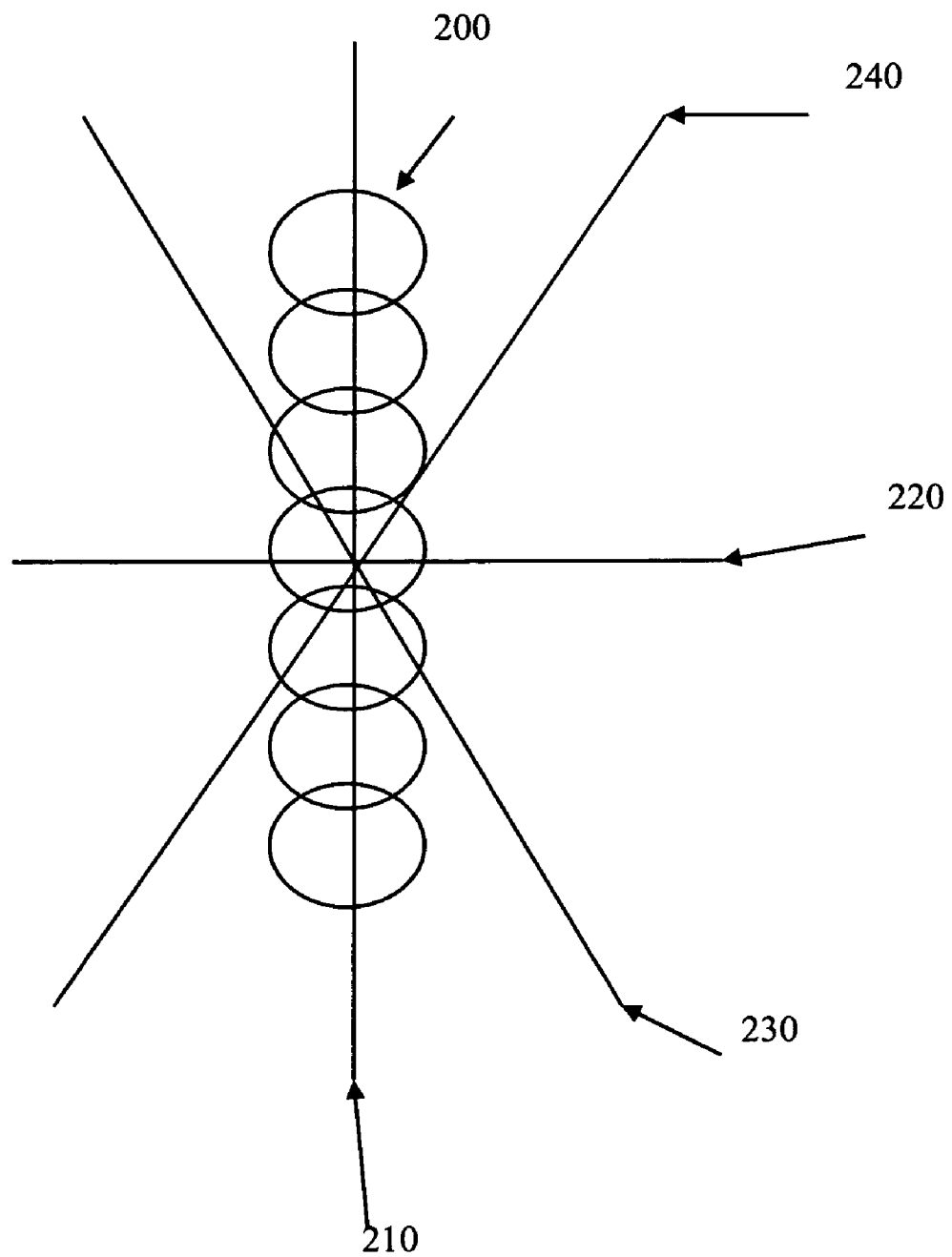
FIG. 2 illustrates a set of different projection directions relative to an array of detectors in an MRI apparatus.

FIG. 2 illustrates different projection directions that may be tested. A first projection may be taken along axis 210. Subsequent projections may be taken along axis 220, axis 230, and/or axis 240. While four directions are illustrated, it is to be appreciated that a greater and/or lesser number of directions may be used. These directions have different relationships (e.g., angles) to the phased array coils 200. As described above, the phase-encoding direction selected affects the coil sensitivity profile. Example systems, methods, and apparatus facilitate selecting a desired phase-encoding direction before a complete MRI session is undertaken by making at least two projections having at least two different directions.

Example systems, methods, and apparatus perform pre-session and/or in session feedback analysis to determine a desired phase-encoding direction. In one example, the desired phase-encoding direction may be an optimal phase-encoding direction. In another example, the desired phase-encoding direction may be the direction that yields the highest spatial encoding from directions tested. For example, rather than testing all possible phase-encoding directions, a small set of directions may be tested and an optimal direction may be selected. In another example, different phase-encoding directions may be tested until a threshold spatial-encoding property is achieved.

Feedback analysis includes acquiring data along a set of test projection directions, analyzing that data with respect to the spatial encoding capabilities of the detectors in relation to the test projection directions, and selecting a phase-encoding direction based on the analysis. While a pre-session analysis that includes acquiring data is described, it is to be appreciated that in one example previously acquired data may be decomposed into multiple projections using, for example, a Radon transform. The previously acquired data may have been acquired from a localizer image, a scout image, and so on.

Example systems, methods, and apparatus may decompose acquired signals into orthogonal basis sets. Acquired signals may be decomposed using, for example, principal component analysis (PCA), singular value decomposition (SVD), quadratic residue decomposition (QR), spectral decomposition, polar decomposition, and so on. The decomposition facilitates determining a phase-encoding direction. The decomposition may be referred to herein as a "signal decomposition". PCA is one linear transformation that can decompose a data set in terms of orthogonal basis functions. Thus, different data sets acquired by the detectors associated with projections along different directions can be decomposed in terms of orthogonal basis functions using PCA or other signal decompositions.

Basis functions, also known as principal components, may be generated by computing eigenvalues and eigenvectors of a covariance matrix of a set of data that is acquired. Different sets of data may be associated with projections along different directions. Performing signal decomposition using, for example, PCA, SVD, QR, and so on, for a data set acquired from pMRI apparatus detectors (e.g., phased array coils) may cause a coordinate system shift for the data set. In the new coordinate system, principle components (e.g., eigenmodes) of the detectors may be the basis functions.

Detectors in a parallel MRI apparatus may be arranged in a phased array of coils. Individual coils may receive signals associated with a projection along a spatial direction. Individual coils may have different sensitivities based on their directional relationship to a projection and their location in a phased array. Thus, different coils may make different contributions to a received signal. Performing signal decomposition on an acquired signal facilitates computing eigenvalues that describe contributions of individual principle components. Therefore, data (e.g., eigenvalues) is available to measure an encoding capability of a phased array. Higher contributions of high-order principle components indicate a higher (e.g., better) encoding capability of a phased array. The higher encoding capability results from having more independent basis functions available for encoding and thus having more data available for analysis.

In one example, analysis may employ the following equation, which is derived from the SMASH (simultaneous acquisition of spatial harmonics) method for parallel imaging:

$$\sum_e n_e^l C_e(x) = e^{i\Delta k_x X} \qquad \text{Equation [1]}$$

where:

n represents a linear weight, and

C represents a coil sensitivity profile.

Equation [1] describes the combination of multiple coil sensitivity profiles to form a complex spatial harmonic sensitivity profile. The effect approximates applying a phase-encoding gradient that modulates a spin-density with a spatial harmonic.

Figure 3:
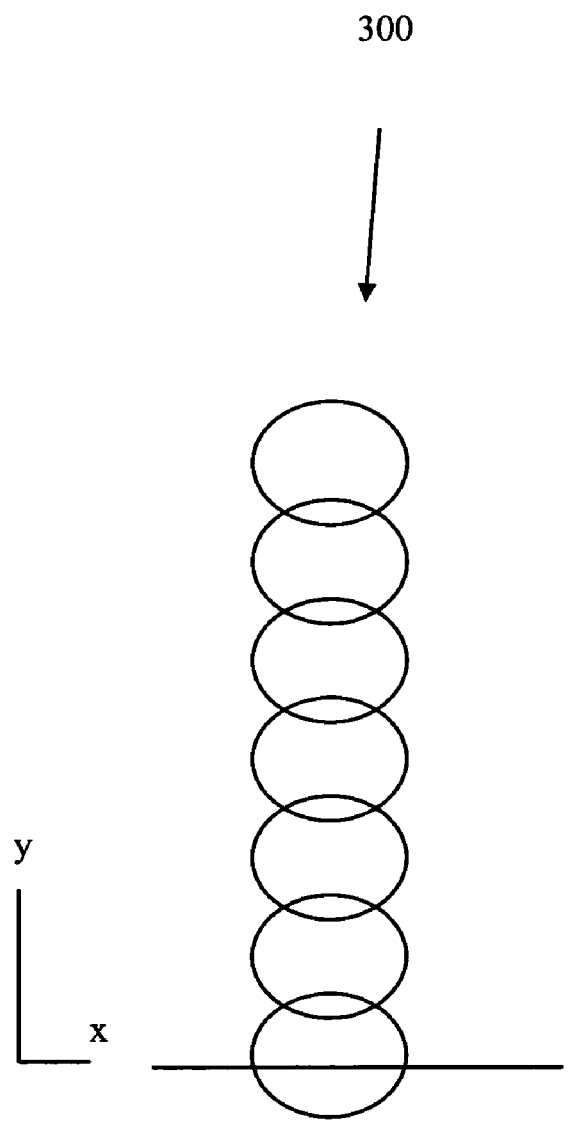
FIG. 3 illustrates a first projection direction that will yield a substantially constant signal in members of array 300.
Figure 4:
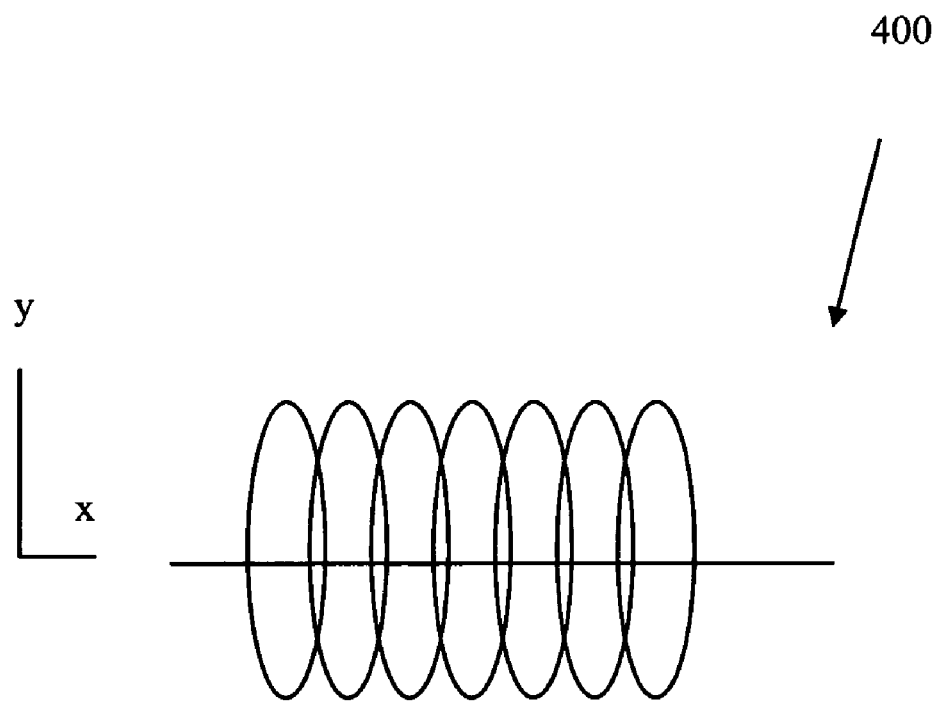
FIG. 4 illustrates a second projection direction that will yield varying signals in members of array 400.

In vivo coil sensitivity calibrations facilitate accurate pMRI reconstruction. Coil sensitivity calibrations may themselves depend on characteristics (e.g., projection direction) of a pre-scan analysis and/or data derived from a decomposition of previously acquired data. FIGS. 3 and 4 illustrate how projection direction may affect coil sensitivity. FIG. 3 illustrates a pre-scan projection that leads to a value (e.g., $C_1(x)$) used in determining the coil sensitivity of a coil being nearly a constant. FIG. 4 illustrates a pre-scan projection that leads to the value not being a constant. A signal acquired using the projection direction 300 would provide less information for analysis and processing than a signal acquired using the projection direction 400. Since $C_1(x)$ is nearly a constant for the projection 300 illustrated in FIG. 3, analysis results would be inferior to analysis that occurs when $C_1(x)$ is not a constant, as would result from the projection 400 illustrated in FIG. 4. Conventionally, whether an object and a projection would produce the situation illustrated in FIG. 3 or the situation illustrated in FIG. 4 may not have been known. Therefore, example systems, methods, and apparatus acquire signal in response to different projection directions and then control a pMRI session based, at least in part, on analysis of the different signal acquired. Performing pre-scan projections along different directions facilitates gathering data that facilitates identifying different situations which in turn facilitates improving coil sensitivity calibrations which in turn may improve pMRI performance.

The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

ASIC: application specific integrated circuit.
CD: compact disk.
CD-R: CD recordable.
CD-RW: CD rewriteable.
DVD: digital versatile disk and/or digital video disk.
HTTP: hypertext transfer protocol.
LAN: local area network.
PCI: peripheral component interconnect.
PCIE: PCI express.
RAM: random access memory.
DRAM: dynamic RAM.
SRAM: synchronous RAM.
ROM: read only memory.
PROM: programmable ROM.
USB: universal serial bus.
WAN: wide area network.

"Computer component", as used herein, refers to a computer-related entity (e.g., hardware, firmware, software in execution, combinations thereof. Computer components may include, for example, a process running on a processor, a processor, an object, an executable, a thread of execution, and a computer. A computer component(s) may reside within a process and/or thread. A computer component may be localized on one computer and/or may be distributed between multiple computers.

"Computer communication", as used herein, refers to a communication between computing devices (e.g., computer, personal digital assistant, cellular telephone) and can be, for example, a network transfer, a file transfer, an applet transfer, an email, an HTTP transfer, and so on. A computer communication can occur across, for example, a wireless system (e.g., IEEE 802.11), an Ethernet system (e.g., IEEE 802.3), a token ring system (e.g., IEEE 802.5), a LAN, a WAN, a point-to-point system, a circuit switching system, a packet switching system, and so on.

"Computer-readable medium", as used herein, refers to a medium that stores signals, instructions and/or data. A computer-readable medium may take forms, including, but not limited to, non-volatile media, and volatile media. Non-volatile media may include, for example, optical disks, magnetic disks, and so on. Volatile media may include, for example, semiconductor memories, dynamic memory, and so on. Common forms of a computer-readable medium may include, but are not limited to, a floppy disk, a flexible disk, a hard disk, a magnetic tape, other magnetic medium, an ASIC, a CD, other optical medium, a RAM, a ROM, a memory chip or card, a memory stick, and other media from which a computer, a processor or other electronic device can read.

"Data store", as used herein, refers to a physical and/or logical entity that can store data. A data store may be, for example, a database, a table, a file, a list, a queue, a heap, a memory, a register, and so on. In different examples, a data store may reside in one logical and/or physical entity and/or may be distributed between two or more logical and/or physical entities.

"Logic", as used herein, includes but is not limited to hardware, firmware, software in execution on a machine, and/or combinations of each to perform a function(s) or an action(s), and/or to cause a function or action from another logic, method, and/or system. Logic may include a software controlled microprocessor, a discrete logic (e.g., ASIC), an analog circuit, a digital circuit, a programmed logic device, a memory device containing instructions, and so on. Logic may include one or more gates, combinations of gates, or other circuit components. Where multiple logical logics are described, it may be possible to incorporate the multiple logical logics into one physical logic. Similarly, where a single logical logic is described, it may be possible to distribute that single logical logic between multiple physical logics.

An "operable connection", or a connection by which entities are "operably connected", is one in which signals, physical communications, and/or logical communications may be sent and/or received. An operable connection may include a physical interface, an electrical interface, and/or a data interface. An operable connection may include differing combinations of interfaces and/or connections sufficient to allow operable control. For example, two entities can be operably connected to communicate signals to each other directly or through one or more intermediate entities (e.g., processor, operating system, logic, software). Logical and/or physical communication channels can be used to create an operable connection.

"Signal", as used herein, includes but is not limited to, electrical signals, optical signals, analog signals, digital signals, data, computer instructions, processor instructions, messages, a bit, a bit stream, or other means that can be received, transmitted and/or detected.

"Software", as used herein, includes but is not limited to, one or more executable instruction that cause a computer, processor, or other electronic device to perform functions, actions and/or behave in a desired manner. "Software" does not refer to stored instructions being claimed as stored instructions per se (e.g., a program listing). The instructions may be embodied in various forms including routines, algorithms, modules, methods, threads, and/or programs including separate applications or code from dynamically linked libraries.

"User", as used herein, includes but is not limited to one or more persons, software, computers or other devices, or combinations of these.

Some portions of the detailed descriptions that follow are presented in terms of algorithms and symbolic representations of operations on data bits within a memory. These algorithmic descriptions and representations are used by those skilled in the art to convey the substance of their work to others. An algorithm, here and generally, is conceived to be a sequence of operations that produce a result. The operations may include physical manipulations of physical quantities. Usually, though not necessarily, the physical quantities take the form of electrical or magnetic signals capable of being stored, transferred, combined, compared, and otherwise manipulated in a logic, and so on. The physical manipulations create a concrete, tangible, useful, real-world result.

It has proven convenient at times, principally for reasons of common usage, to refer to these signals as bits, values, elements, symbols, characters, terms, numbers, and so on. It should be borne in mind, however, that these and similar terms are to be associated with the appropriate physical quantities and are merely convenient labels applied to these quantities. Unless specifically stated otherwise, it is appreciated that throughout the description, terms including processing, computing, determining, and so on, refer to actions and processes of a computer system, logic, processor, or similar electronic device that manipulates and transforms data represented as physical (electronic) quantities.

Example methods may be better appreciated with reference to flow diagrams. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement an example methodology. Blocks may be combined or separated into multiple components. Furthermore, additional and/or alternative methodologies can employ additional, not illustrated blocks.

Figure 1:
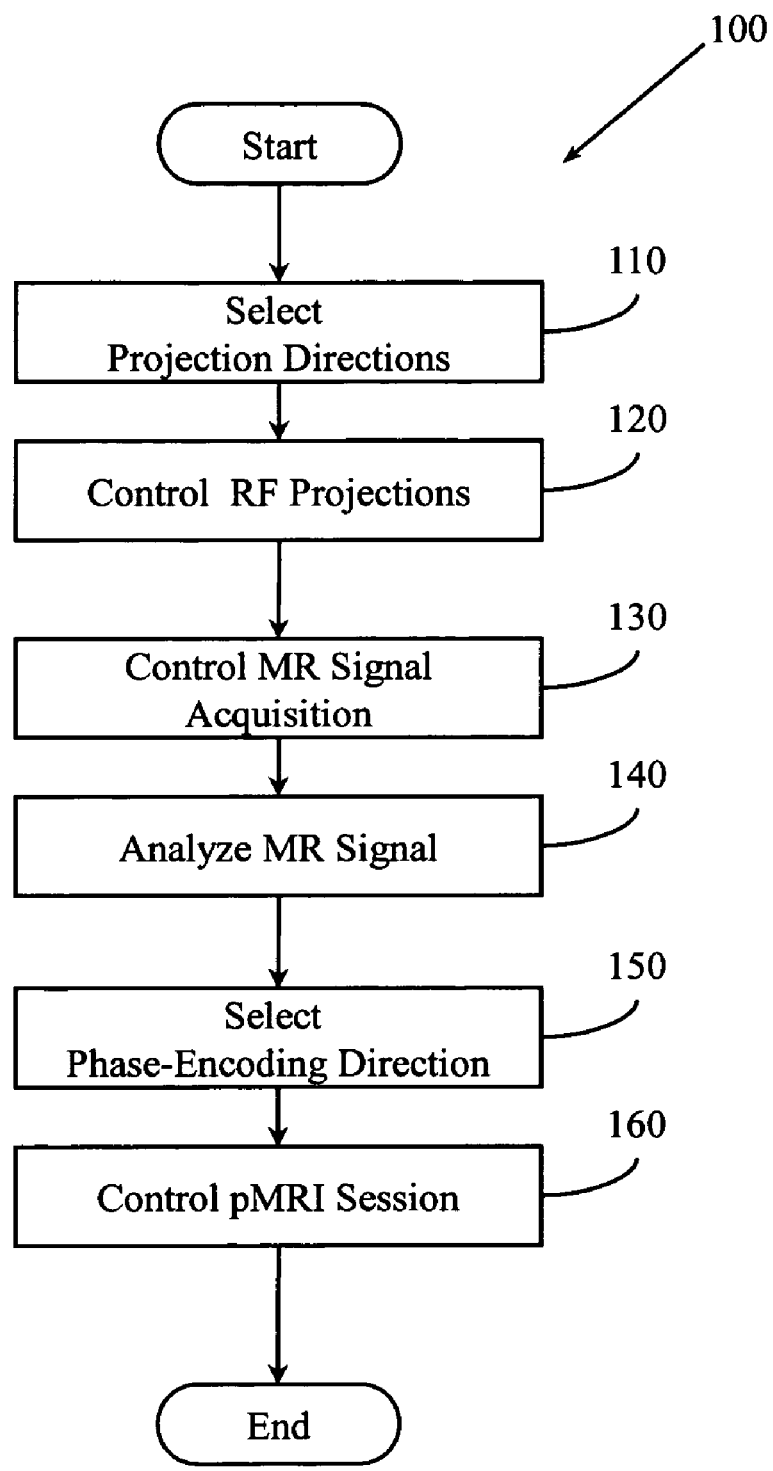
FIG. 1 illustrates an example method for selecting a phase-encoding direction.

FIG. 1 illustrates a method 100 that facilitates selecting a phase-encoding direction for an MRI session. In one example, method 100 will determine an optimal phase-encoding direction. In another example, method 100 will determine a superior (e.g., best-available) phase-encoding direction of those phase-encoding directions tested. In another example, method 100 will predict a superior phase-encoding direction based on the phase-encoding directions tested. Based on time and/or processing constraints, a "superior" solution may be determined instead of an "optimal" solution.

Method 100 includes, at 110, selecting a set of projection directions along which an MRI apparatus is to acquire projections of an object to be imaged. The object may be, for example, a portion of a human. The set of projection directions may include two or more directions (e.g., 2°, 4°, 45°, 90°, 360°). The set of projection directions may be selected based, for example, on a user input, on a default configuration, on a configuration associated with a body part to be imaged, on a configuration associated with a type of MRI session to be performed, and so on. Different sized sets may be employed in different examples.

Method 100 also includes, at 120, controlling the MRI apparatus to produce gradients that produce the set of projection directions. Controlling the MRI apparatus may include, for example, providing a signal to the MRI apparatus, writing a value to a memory in the MRI apparatus, activating a circuit in the MRI apparatus, uploading a file to a control computer associated with the MRI apparatus, and so on.

Method 100 also includes, at 130, controlling the MRI apparatus to acquire MR signal from the object through a set of detectors. In one example, the set of detectors may be a phased array of coils. Controlling the MRI apparatus to acquire the MR signal may include, for example, providing a signal to the MRI apparatus, writing a value to a register in a control circuit associated with the MRI apparatus, providing a voltage to a control circuit associated with the MRI apparatus, and so on.

Method 100 also includes, at 140, analyzing the MR signal to identify individual sensitivities for members of the set of detectors. Analyzing the MR signal may include performing a signal decomposition on the MR signal. The signal decomposition may be, for example, a principal component analysis (PCA), a singular value decomposition (SVD), a spectral decomposition, a polar decomposition, a quadratic residue (QR) decomposition, and so on. Analyzing the MR signal may include producing a spatial harmonic sensitivity profile for the phased array of coils. In one example, the spatial harmonic sensitivity profile may be based on equation [1].

Method 100 also includes, at 150, selecting a phase-encoding direction for a pMRI session based, at least in part, on the individual sensitivities of the members. In one example, the phase-encoding direction may be associated with the projection direction that yielded the largest signal. In another example, the phase-encoding direction may not be associated with the projection direction that yielded the largest signal, but rather may be associated with a projection direction(s) that yielded an acceptable signal. For example, in some applications (e.g., arterial spin labeling (ASL)), possible projection directions and thus possible phase-encoding directions may be limited due to relationships between anatomical positioning, patient positioning, blood flow direction(s), gating issues, and so on. Thus, a "best-available" phase-encoding direction may be selected even though it produces a lower signal than an "optimal" phase-encoding direction.

Method 100 also includes, at 160, controlling the MRI apparatus to perform the pMRI session based, at least in part, on the selected phase-encoding direction. Once again controlling the MRI apparatus may include writing a value to the MRI apparatus, providing a signal to the MRI apparatus, providing a voltage to a circuit in the MRI apparatus, invoking a stored procedure on the MRI apparatus, and so on.

While FIG. 1 illustrates various actions occurring in serial, it is to be appreciated that various actions illustrated in FIG. 1 could occur substantially in parallel. By way of illustration, a first process could select projection directions and control an MRI apparatus to produce gradients that produce a set of projection directions, a second process could control the MRI apparatus to acquire signal, and a third process could analyze received signal and select a phase-encoding direction for a pMRI session. While three processes are described, it is to be appreciated that a greater and/or lesser number of processes could be employed and that lightweight processes, regular processes, threads, and other approaches could be employed.

In one example, a method may be implemented as computer executable instructions. Thus, in one example, a computer-readable medium may store computer executable instructions that if executed by a machine (e.g., processor) cause the machine to perform method 100. While executable instructions associated with the method 100 are described as being stored on a computer-readable medium, it is to be appreciated that executable instructions associated with other example methods described herein may also be stored on a computer-readable medium.

Figure 5:
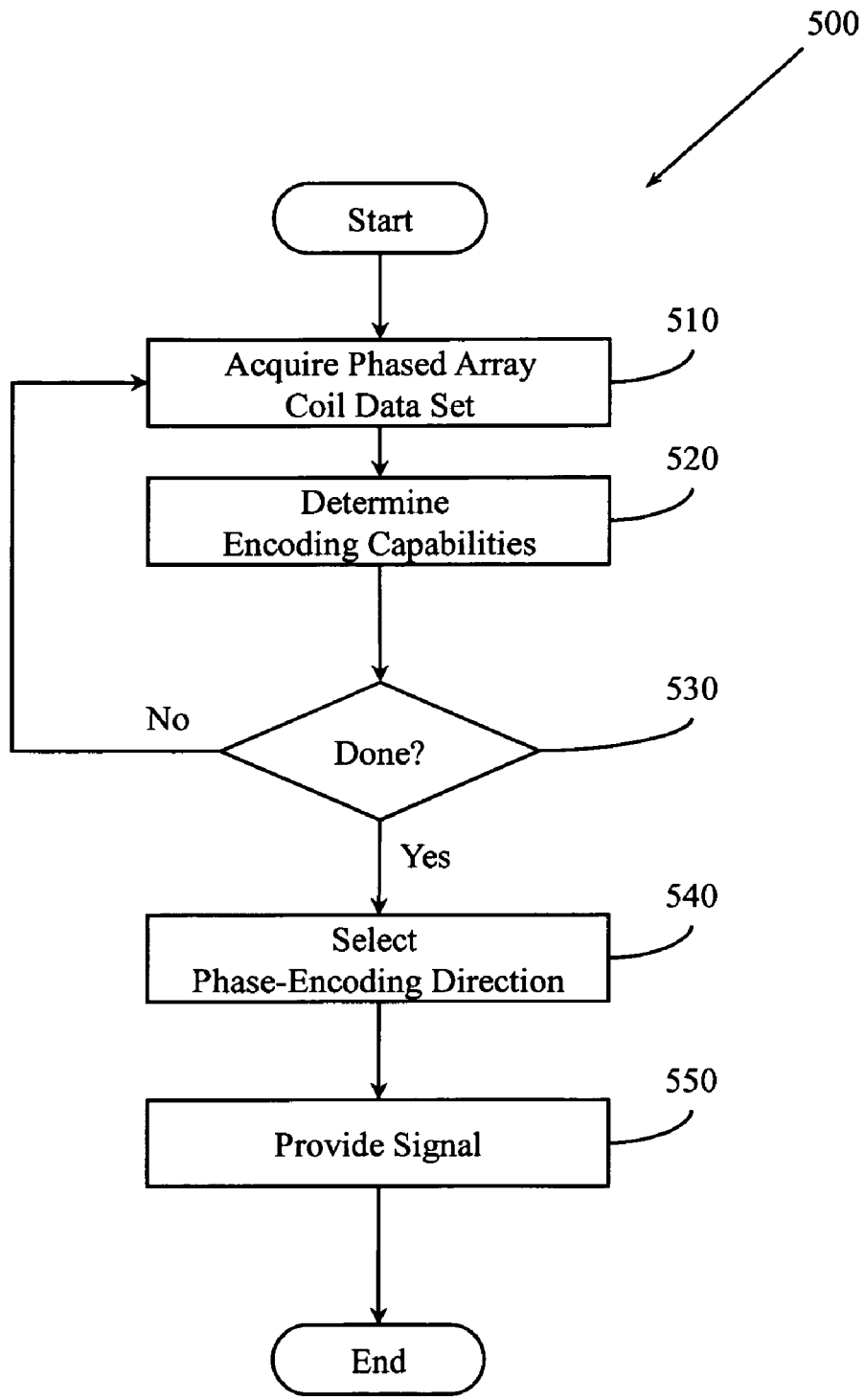
FIG. 5 illustrates an example method for selecting a phase-encoding direction.

FIG. 5 illustrates a method 500 associated with determining a phase-encoding direction(s) for a pMRI session(s). Method 500 includes, at 510, acquiring a set of data from a phased array of coils in a pMRI apparatus. The set of data may be associated with projections along a first set of spatial directions. To be able to compare different encoding capabilities, the first set of spatial directions is to include at least two projection directions. While at least two projection directions are described, it is to be appreciated that a greater number of projection directions may be employed. For example, an evenly spaced set of 15 projections may divide a 360 degree problem space into 24 equal slices. In another example, an unevenly spaced set of projections may divide a problem space into unequal slices.

Method 500 may also include, at 520, determining an encoding capability for the spatial directions based on a signal decomposition of the set of data. The signal decomposition may be performed using various decomposition techniques described herein (e.g., PCA, SVD).

Method 500 may include, at 530, determining whether data acquisition and encoding capability have been completed. The determination may depend, for example, on the nature of the different encoding capabilities determined at 520 from the data acquired at 510. For example, if the different encoding capabilities differ by a threshold amount and/or provide a signal intensity that exceeds a threshold amount, then the determination at 530 may be yes. If, however, the different encoding capabilities determined at 520 do not exceed a difference threshold or do not provide a minimum acceptable signal intensity, then the determination at 530 may be no.

Method 500 includes, at 540, selecting a phase-encoding direction based on the encoding capabilities determined at 520. In one example, the phase-encoding direction may be associated with a highest determined encoding capability. In another example, the phase-encoding direction may be associated with a determined encoding capability that exceeds an encoding capability threshold. This phase-encoding direction may not be the highest determined encoding possible, but may be acceptable and may be determined within an acceptable time frame.

Method 500 also includes, at 550, providing a signal corresponding to the selected phase-encoding direction. The signal is provided after the phase-encoding direction is selected after at least two applications of gradients to produce at least two different projection directions. The imaging volume may be, for example, a portion of an item (e.g., human body) in an MRI apparatus. A phased array detector in an MRI apparatus receives signals in response to the applications of the RF energy and data associated with the signals is then analyzed using a signal decomposition (e.g., PCA, SVD, QR). Based on the signal decomposition analysis, an optimal and/or desired phase-encoding direction may be selected. To determine the encoding capability along a single spatial direction, a signal decomposition is performed for a single projection along that direction. In one example, this projection may be measured directly. In another example, this projection may be obtained after a Radon transform of a pre-scan of the imaging volume.

Figure 6:
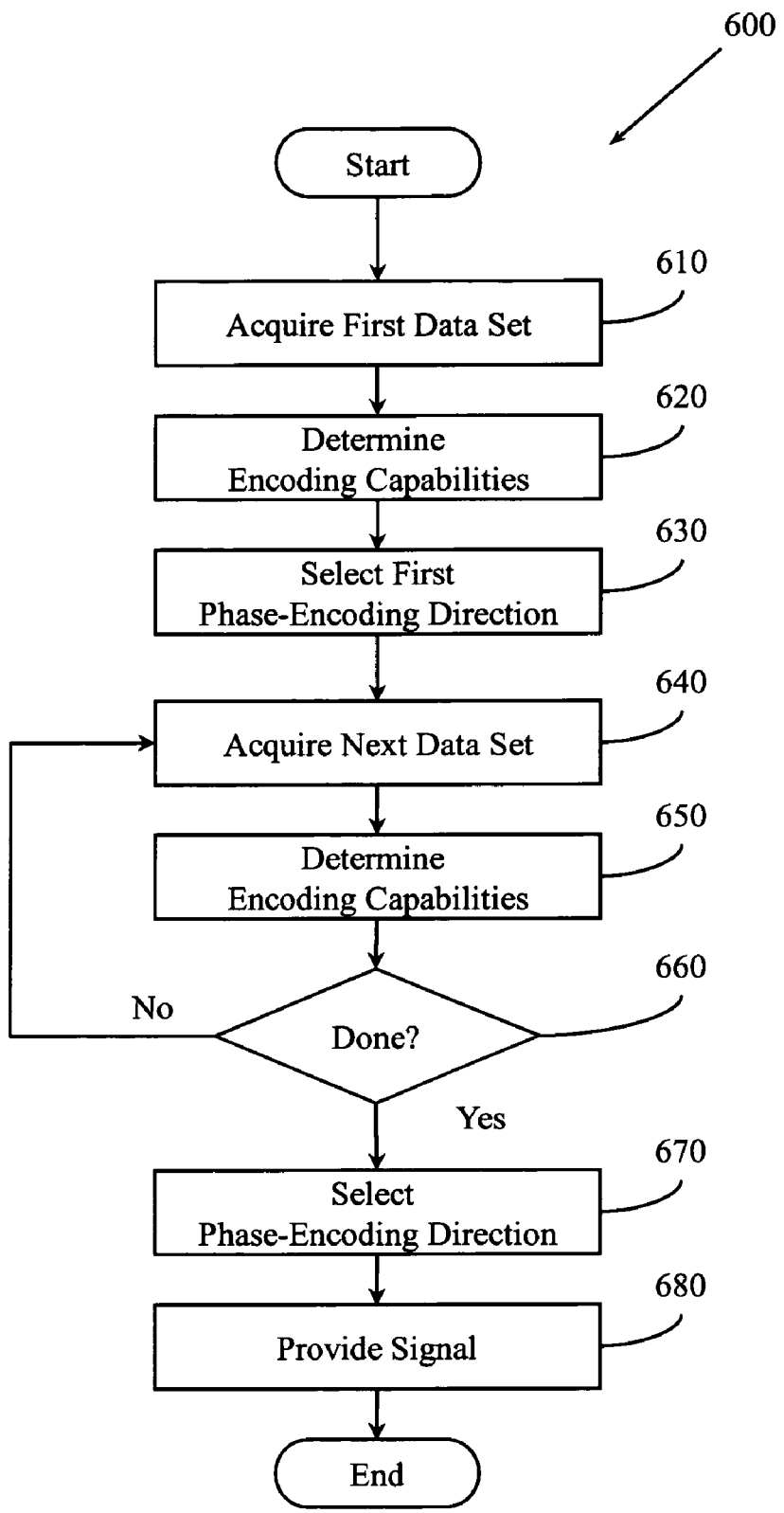
FIG. 6 illustrates an example method for selecting a phase-encoding direction.

FIG. 6 illustrates a method 600 associated with determining phase-encoding direction for pMRI where the method includes multiple iterations of test signal acquisition. Consider an MRI apparatus that can produce projections along 360 directions (e.g., one per degree in a circle). While 360 projections may be possible, it may be too time-consuming to acquire and analyze all 360 projections. Thus, in one example, a first set of encoding directions may be examined. For example, four encoding directions that differ from each other by fifteen degrees may be taken. The four data sets may then be analyzed. A determination may then be made about candidate projection directions. For example, the four sets of data may indicate that pMRI performance will improve when the projection direction moves away from a first projection direction and pMRI performance may decrease when the projection direction moves towards the first projection direction. Thus, candidate direction(s) may be selected for subsequent analysis based on the initial set of projection directions. The candidate directions may then be analyzed to select an optimal or superior phase-encoding direction. One skilled in the art will appreciate that various partitioning techniques (e.g., binary search) may be performed to reduce and/or minimize the number of projections employed to identify an optimal, improved, and/or adequate projection direction.

After a desired phase-encoding direction is selected, a signal corresponding to the direction selected is provided. This signal may be provided, for example, to a pMRI control logic to facilitate controlling a pMRI apparatus to perform a pMRI session based on the desired phase-encoding direction. In one example, the phase-encoding direction may be an optimal direction. In another example, the phase-encoding direction may not be the optimal direction, but may be a best direction detected and/or predicted in an allotted amount of time using an allotted amount of resources to perform an allotted number of projections. This signal may then be used to control an MRI apparatus during a pMRI session.

Thus, method 600 includes, at 610, acquiring a first set of data from a phased array of coils in a pMRI apparatus. The first set of data may be associated with projections along a first set of spatial directions. Method 600 may also include, at 620, determining a first encoding capability for the first spatial directions. The encoding capabilities may be based on a signal decomposition (e.g., PCA) of the first set of data. Having determined the capabilities at 620, method 600 may proceed, at 630, to select a first phase-encoding direction based on the determined first encoding capability. This first phase-encoding direction may be determined by comparing the sensitivities determined for the different projections and predicting a direction that will produce a desired result (e.g., varied spatial encoding values).

Method 600 may then proceed, at 640, to acquire a second set of data from the phased array of coils. The second set of data will be associated with projections along a second set of spatial directions. The second set of spatial directions will be selected based, at least in part, on the first phase-encoding direction. For example, the second set of spatial directions may bracket and fan out from the first phase-encoding direction. In this way, coil sensitivities associated with relevant projection directions may be examined and coil sensitivities associated with irrelevant projections may be ignored.

Method 600 may then proceed, at 650, by determining encoding capabilities for the second spatial directions. Once again the encoding capabilities may be based on signal decomposition (e.g., PCA) of the second set of data. At 660 a determination may be made concerning whether to iterate through acquiring another data set(s) based on the encoding capabilities determined at 650. The determination may depend, for example, on whether the encoding capabilities satisfy a difference threshold, on whether the encoding capabilities satisfy an intensity threshold, on whether additional time is available, and so on.

If the determination at 660 is no, then processing returns to 640 where another set of data is acquired based on projections related to encoding capabilities and directions analyzed at 650. One skilled in the art will appreciate that method 600 may iterate though actions 640, 650, and 660 multiple times. If the determination at 660 is yes, then processing moves on to 670 where a second phase-encoding direction is selected. The second phase-encoding direction may be selected based, at least in part, on the determined second encoding capability. In different examples the second phase-encoding direction may be an optimal direction, may be the first direction that satisfies a threshold, and so on.

Method 600 concludes, at 680, by providing a signal corresponding to the second phase-encoding direction. The signal may be provided to a pMRI control logic that controls phase encoding for a pMRI session.

Figure 7:
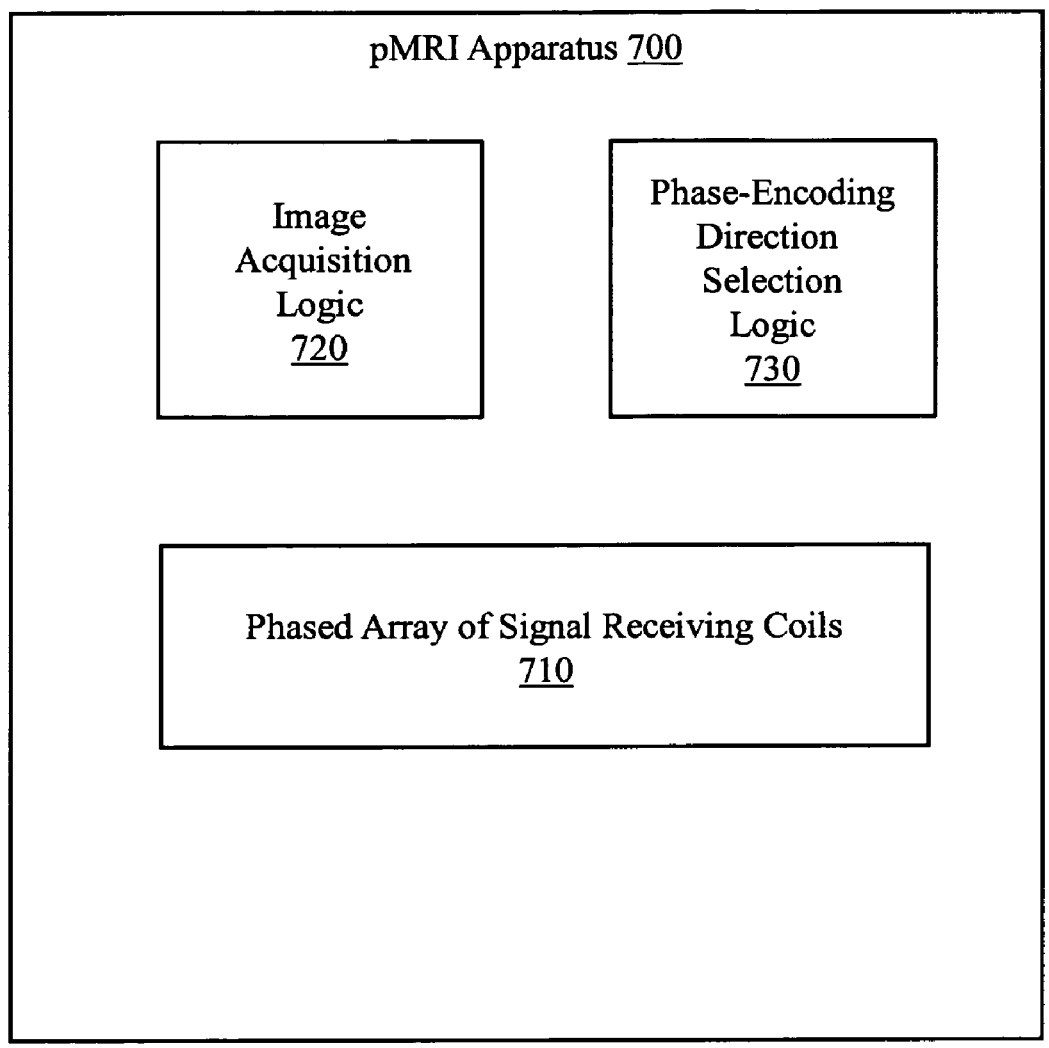
FIG. 7 illustrates an apparatus for controlling phase-encoding direction in pMRI.

FIG. 7 illustrates a pMRI apparatus 700. Apparatus 700 includes a phased array of signal receiving coils 710. The phased array 710 is to receive MR signals from an object to which the pMRI apparatus 700 applies RF energy. The pMRI apparatus 700 is to produce gradients that produce a set of projection directions.

Apparatus 700 includes an image acquisition logic 720 to reconstruct an image from the MR signals. Image quality may depend on the spatial encoding capabilities of the phased array 710. Therefore apparatus 700 includes a phase-encoding direction selection logic 730. Logic 730 is to perform a signal decomposition on test data acquired from the phased array 710. The test data is acquired in response to the pMRI apparatus 700 producing gradients that produce different projections in different directions during a calibration phase. The signal decomposition performed by logic 730 is to measure the encoding capability of the phased array 710 for the different directions. The encoding capabilities are then examined to facilitate selecting a phase-encoding direction for a pMRI session. The phase-encoding direction is to be based, at least in part, on the encoding capability of the phased array 710 as determined by the logic 730. In one example, the image acquisition logic 720 is controlled to reconstruct at least a portion of an image based on a phase-encoding direction as selected by the phase-encoding direction selection logic 730

Figure 8:
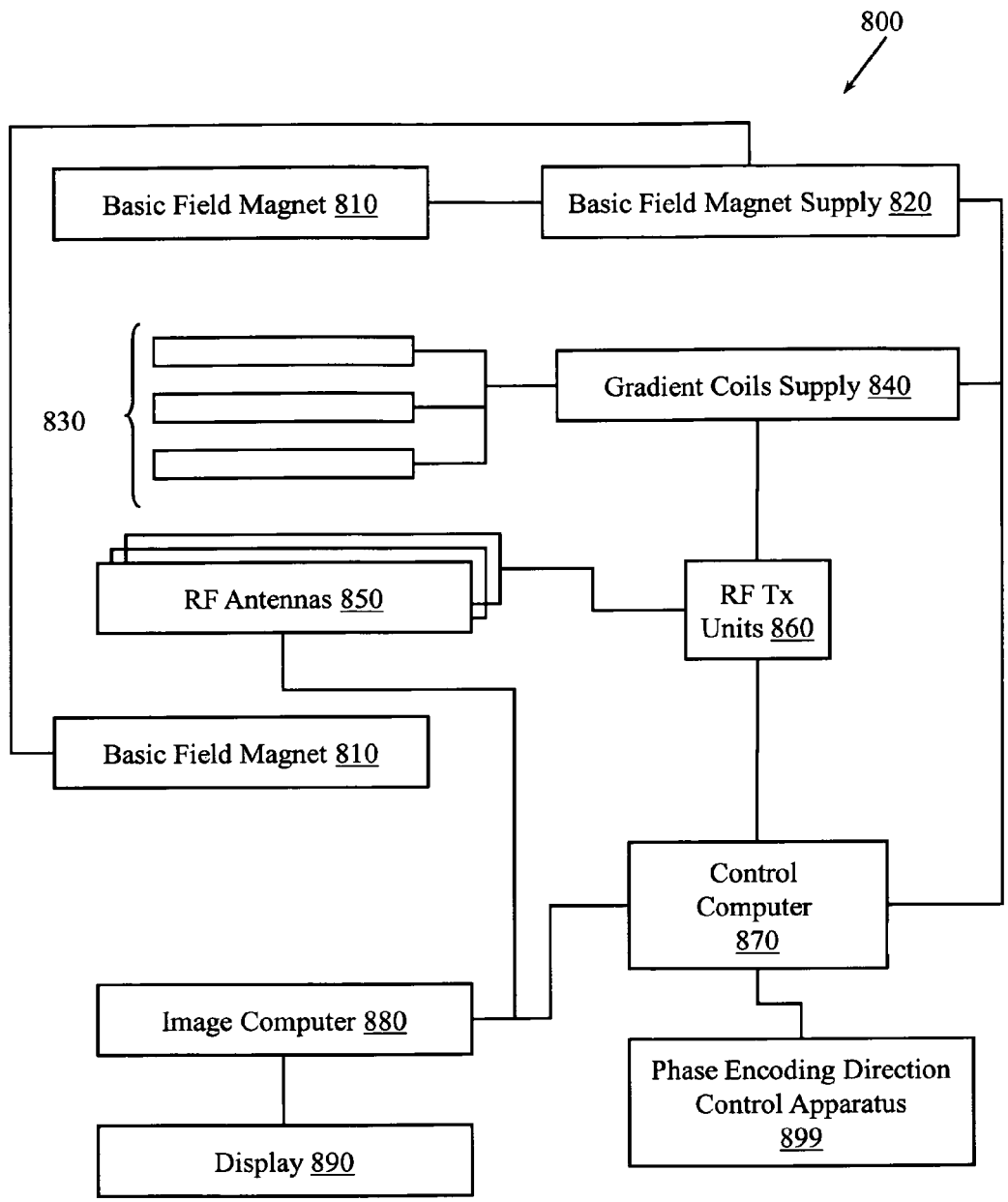
FIG. 8 illustrates an MRI apparatus configured with a phase-encoding direction control logic.

FIG. 8 illustrates an example MRI apparatus 800 configured with a phase encoding direction control apparatus 899 to facilitate intelligently selecting a phase encoding direction for a pMRI session based on feedback received in response to gradients being applied to produce different projections. The phase encoding direction control apparatus 899 may be configured with elements of example apparatus described herein and/or may perform example methods described herein.

The apparatus 800 includes a basic field magnet(s) 810 and a basic field magnet supply 820. Ideally, the basic field magnets 810 would produce a uniform $B_0$ field. However, in practice, the $B_0$ field may not be uniform, and may vary over an object being imaged by the MRI apparatus 800. MRI apparatus 800 may include gradient coils 830 configured to emit gradient magnetic fields like $G_S$, $G_P$ and $G_R$. The gradient coils 830 may be controlled, at least in part, by a gradient coils supply 840. In some examples, the timing, strength, and orientation of the gradient magnetic fields may be controlled, and thus selectively adapted during an MRI procedure.

MRI apparatus 800 may include a set of RF antennas 850 that are configured to generate RF pulses and to receive resulting magnetic resonance signals from an object to which the RF pulses are directed. In some examples, how the pulses are generated and how the resulting MR signals are received may be controlled and thus may be selectively adapted during an MRI procedure. Separate RF transmission and reception coils can be employed. The RF antennas 850 may be controlled, at least in part, by a set of RF transmission units 860. An RF transmission unit 860 may provide a signal to an RF antenna 850.

The gradient coils supply 840 and the RF transmission units 860 may be controlled, at least in part, by a control computer 870. In one example, the control computer 870 may be programmed to control a pMRI device as described herein. The magnetic resonance signals received from the RF antennas 850 can be employed to generate an image and thus may be subject to a transformation process like a two dimensional FFT that generates pixilated image data. The transformation can be performed by an image computer 880 or other similar processing device. The image data may then be shown on a display 890. While FIG. 8 illustrates an example MRI apparatus 800 that includes various components connected in various ways, it is to be appreciated that other MRI apparatus may include other components connected in other ways.

Figure 9:
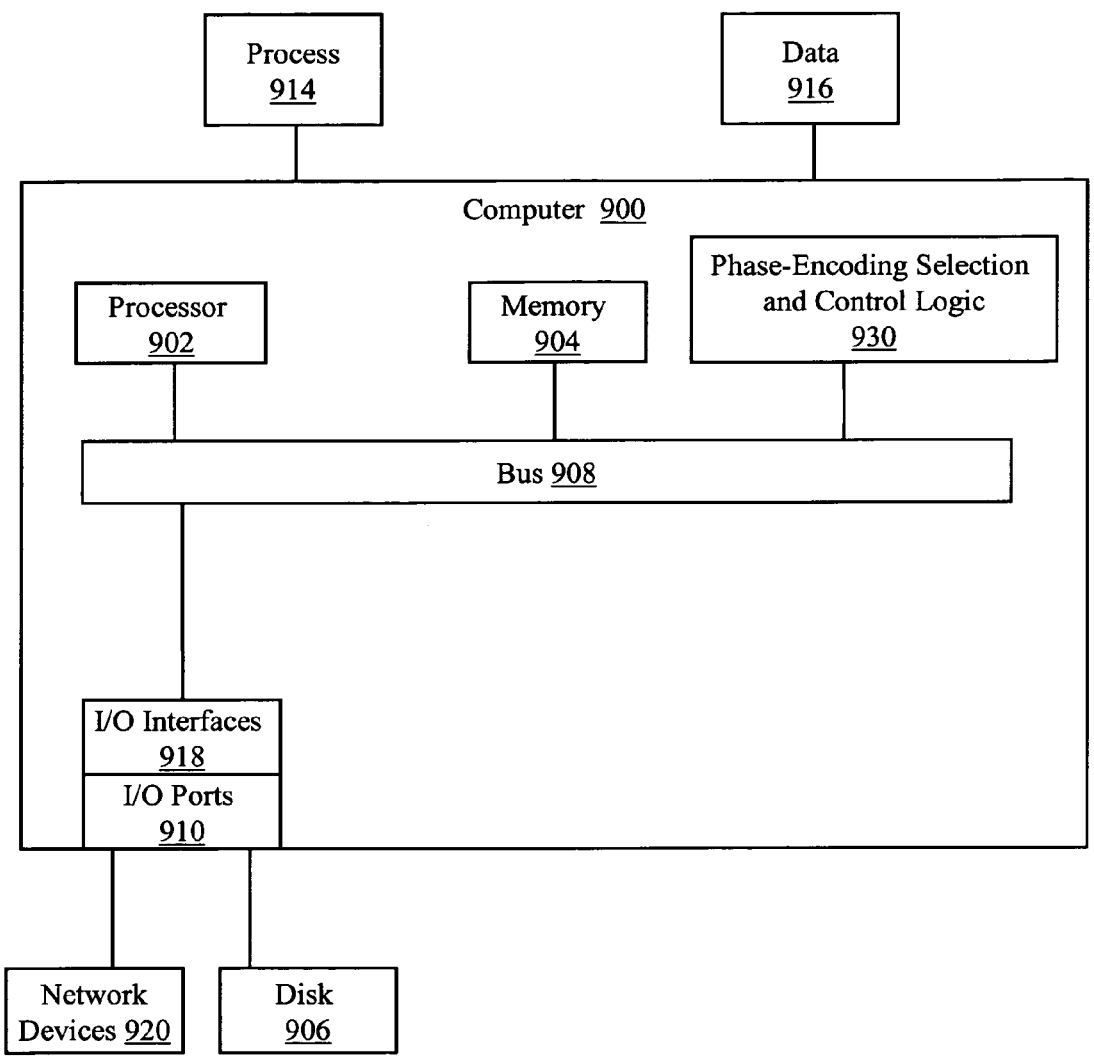
FIG. 9 illustrates a computing device in which example methods described herein may be performed to control an MRI apparatus with respect to phase-encoding direction.

FIG. 9 illustrates an example computing device in which example methods described herein, and equivalents, may operate. The example computing device may be a computer 900 that includes a processor 902, a memory 904, and input/output ports 910 operably connected by a bus 908. In one example, the computer 900 may include a phase-encoding selection and control logic 930 to facilitate controlling a pMRI apparatus with respect to phase-encoding direction for a pMRI session. In different examples, the logic 930 may be implemented in hardware, software, firmware, and/or combinations thereof. While the logic 930 is illustrated as a hardware component attached to the bus 908, it is to be appreciated that in one example, the logic 930 could be implemented in the processor 902.

Thus, logic 930 may provide means (e.g., hardware, software, firmware) for acquiring a set of test signals from a phased array of coils associated with a pMRI apparatus. In one example, the set of test signals are produced in response to gradients being applied to produce a set of different projection directions. The means may be implemented, for example, as an ASIC programmed to control transmit and/or receive antennas. The means may also be implemented as computer executable instructions that are presented to computer 900 as data 916 that are temporarily stored in memory 904 and then executed by processor 902. Logic 930 may also provide means (e.g., hardware, software, firmware) for determining individual coil sensitivities for members of the phased array of coils for the different projection directions. The individual coil sensitivities may be determined, for example, in response to signal decomposition. Logic 930 may also provide means (e.g., hardware, software, firmware) for controlling a pMRI apparatus to perform a pMRI session where gradients are applied to produce a selected projection direction. The selected projection direction is based, at least in part, on the determined individual coil sensitivities.

Generally describing an example configuration of the computer 900, the processor 902 may be a variety of various processors including dual microprocessor and other multi-processor architectures. A memory 904 may include volatile memory and/or non-volatile memory. Non-volatile memory may include, for example, ROM, PROM, and so on. Volatile memory may include, for example, RAM, SRAM, DRAM, and so on.

A disk 906 may be operably connected to the computer 900 via, for example, an input/output interface (e.g., card, device) 918 and an input/output port 910. The disk 906 may be, for example, a magnetic disk drive, a solid state disk drive, a floppy disk drive, a tape drive, a Zip drive, a flash memory card, a memory stick, and so on. Furthermore, the disk 906 may be a CD-ROM drive, a CD-R drive, a CD-RW drive, a DVD ROM, and so on. The memory 904 can store a process 914 and/or a data 916, for example. The disk 906 and/or the memory 904 can store an operating system that controls and allocates resources of the computer 900.

The bus 908 may be a single internal bus interconnect architecture and/or other bus or mesh architectures. While a single bus is illustrated, it is to be appreciated that the computer 900 may communicate with various devices, logics, and peripherals using other busses (e.g., PCIE, 1394, USB, Ethernet). The bus 908 can be types including, for example, a memory bus, a memory controller, a peripheral bus, an external bus, a crossbar switch, and/or a local bus.

The computer 900 may interact with input/output devices via the i/o interfaces 918 and the input/output ports 910. Input/output devices may be, for example, a keyboard, a microphone, a pointing and selection device, cameras, video cards, displays, the disk 906, the network devices 920, and so on. The input/output ports 910 may include, for example, serial ports, parallel ports, and USB ports. The computer 900 can operate in a network environment and thus may be connected to the network devices 920 via the i/o interfaces 918, and/or the i/o ports 910. Through the network devices 920, the computer 900 may interact with a network. Through the network, the computer 900 may be logically connected to remote computers. Networks with which the computer 900 may interact include, but are not limited to, a LAN, a WAN, and other networks.

In one example, computer 900 may be programmed to select a phase-encoding direction for an MRI session in a pMRI apparatus based on the computed encoding capability of a phased array of receiver coils in the pMRI apparatus. The encoding capability may be computed by a PCA of data sets associated with sets of signals received in the phased array in response to gradients that produce a set of projection directions and RF energy being applied to an item in the MRI apparatus. The computer 900 may then provide a signal corresponding to the selected phase-encoding direction.

While example systems, methods, and so on have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on described herein. Therefore, the invention is not limited to the specific details, the representative apparatus, and illustrative examples shown and described. Thus, this application is intended to embrace alterations, modifications, and variations that fall within the scope of the appended claims.

To the extent that the term "includes" or "including" is employed in the detailed description or the claims, it is intended to be inclusive in a manner similar to the term "comprising" as that term is interpreted when employed as a transitional word in a claim.

To the extent that the term "or" is employed in the detailed description or claims (e.g., A or B) it is intended to mean "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

To the extent that the phrase "one or more of, A, B, and C" is employed herein, (e.g., a data store configured to store one or more of, A, B, and C) it is intended to convey the set of possibilities A, B, C, AB, AC, BC, and/or ABC (e.g., the data store may store only A, only B, only C, A&B, A&C, B&C, and/or A&B&C). It is not intended to require one of A, one of B, and one of C. When the applicants intend to indicate "at least one of A, at least one of B, and at least one of C", then the phrasing "at least one of A, at least one of B, and at least one of C" will be employed.

What is claimed is:

1. A method, comprising:
   acquiring a set of data from a phased array of coils in a parallel MRI (pMRI) apparatus, the set of data being associated with projections along a set of spatial directions;
   determining an encoding capability for the set of spatial directions based on a signal decomposition of the set of data;
   selecting a phase-encoding direction based on the determined encoding capability; and
   providing a signal corresponding to the selected phase-encoding direction.

2. The method of claim 1, the signal decomposition being one of, a principal component analysis (PCA), a singular value decomposition (SVD), a spectral decomposition, a polar decomposition, and a quadratic residue (QR) decomposition.

3. The method of claim 1, where the phase-encoding direction is associated with a highest determined encoding capability.

4. The method of claim 1, where the phase-encoding direction is associated with a determined encoding capability that exceeds an encoding capability threshold.

5. A method, comprising:
   acquiring a first set of data from a phased array of coils in a parallel MRI (pMRI) apparatus, the first set of data being associated with projections along a first set of first spatial directions;
   determining a first set of encoding capabilities for the first set of spatial directions based on a signal decomposition of the first set of data;
   selecting a first phase-encoding direction based on the first set of encoding capabilities;
   acquiring a second set of data from the phased array of coils, the second set of data being associated with projections along a second set of second spatial directions, the second set of spatial directions being selected based, at least in part, on the first phase-encoding direction;
   determining a second set of encoding capabilities for the second set of spatial directions based on the signal decomposition of the second set of data;
   selecting a second phase-encoding direction based on the second set of encoding capabilities; and
   providing a signal corresponding to the second phase-encoding direction.

6. The method of claim 5, the method being performed in a pMRI apparatus.

7. A pMRI apparatus, comprising:
   a phased array of signal receiving coils to receive MR signals;
   an image acquisition logic to reconstruct an image from the MR signals; and
   a phase-encoding direction selection logic to perform a signal decomposition on data acquired from the phased array of signal coils in response to the pMRI apparatus acquiring different projections in different directions, where the signal decomposition is to measure the encoding capability of the phased array for the different directions, and to select a phase-encoding direction for a pMRI session based, at least in part, on the encoding capability of the phased array as determined by the signal decomposition.

8. The pMRI apparatus of claim 7, the image acquisition logic being controlled to reconstruct at least a portion of an image based on a phase-encoding direction as selected by the phase-encoding direction selection logic.

9. The pMRI apparatus of claim 7, where the signal decomposition is one of a principal component analysis (PCA), a singular value decomposition (SVD), a spectral decomposition, a polar decomposition, and a quadratic residue (QR) decomposition.

10. The pMRI apparatus of claim 7, where the phase-encoding direction selection logic is to produce a spatial harmonic sensitivity profile of the phased array of signal receiving coils.

11. The pMRI apparatus of claim 10, where the spatial harmonic sensitivity profile is based, at least in part, on:

$$\sum_e n_e^1 C_e(x) = e^{i\Delta_{k_x} X}$$

where:
n represents a linear weight, and
C represents a coil sensitivity profile.

12. A computer-readable medium storing computer executable instructions that when executed by a computer control the computer to perform a method, the method comprising:
   selecting a phase-encoding direction for a magnetic resonance imaging (MRI) session in a parallel MRI (pMRI) apparatus based on the computed encoding capability of a phased array of receiver coils in the pMRI apparatus, where the encoding capability is computed by a principal component analysis (PCA) of two or more data sets associated with two or more sets of signals received in the phased array in response to radio frequency (RF) energy applied to an item in the MRI apparatus encoded along two or more spatial directions, and
   providing a signal corresponding to the selected phase-encoding direction.

* * * * *

UNITED STATES PATENT AND TRADEMARK OFFICE
CERTIFICATE OF CORRECTION

PATENT NO. : 7,741,843 B2  Page 1 of 1
APPLICATION NO. : 12/150848
DATED : June 22, 2010
INVENTOR(S) : Griswold et al.

It is certified that error appears in the above-identified patent and that said Letters Patent is hereby corrected as shown below:

On the Title Page, Item (57) Abstract:

In line 3, delete "example, method" and insert --example method--.

In line 6, delete "selecting" and insert --select--.

Signed and Sealed this

Third Day of August, 2010

David J. Kappos
*Director of the United States Patent and Trademark Office*